United States Patent
Liu et al.

(10) Patent No.: US 7,829,988 B2
(45) Date of Patent: Nov. 9, 2010

(54) STACKING QUAD PRE-MOLDED COMPONENT PACKAGES, SYSTEMS USING THE SAME, AND METHODS OF MAKING THE SAME

(75) Inventors: Yong Liu, Scarborough, ME (US); Howard Allen, Limington, ME (US); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/235,227

(22) Filed: Sep. 22, 2008

(65) Prior Publication Data
US 2010/0072590 A1 Mar. 25, 2010

(51) Int. Cl.
*H01L 21/50* (2006.01)
(52) U.S. Cl. ............... 257/678; 257/676; 257/E23.043; 438/123
(58) Field of Classification Search .......... 257/666, 257/676, E23.004, E23.043, E23.05, 678; 438/121, 123
See application file for complete search history.

(56) References Cited

U.S. PATENT DOCUMENTS

| | | | |
|---|---|---|---|
| 5,198,888 A | 3/1993 | Sugano et al. |
| 6,133,634 A | 10/2000 | Joshi |
| 6,423,623 B1 | 7/2002 | Bencuya et al. |
| 6,459,148 B1 | 10/2002 | Chun-Jen et al. |
| 6,489,678 B1 | 12/2002 | Joshi |
| 6,545,367 B2 | 4/2003 | Sota |
| 6,627,991 B1 | 9/2003 | Joshi |
| 6,645,791 B2 | 11/2003 | Noquil et al. |
| 6,661,082 B1 | 12/2003 | Granada et al. |
| 6,696,321 B2 | 2/2004 | Joshi |
| 6,731,013 B2 | 5/2004 | Juso et al. |
| 6,777,800 B2 | 8/2004 | Madrid et al. |
| 6,876,066 B2 | 4/2005 | Fee et al. |
| 6,893,901 B2 | 5/2005 | Madrid |
| 6,977,431 B1 | 12/2005 | Oh et al. |
| 6,992,384 B2 | 1/2006 | Joshi |
| 7,023,077 B2 | 4/2006 | Madrid |
| 7,061,077 B2 | 6/2006 | Joshi |
| 7,101,734 B2 | 9/2006 | Granada et al. |
| 7,122,884 B2 | 10/2006 | Cabahug et al. |
| 7,157,799 B2 | 1/2007 | Noquil et al. |
| 7,217,594 B2 | 5/2007 | Manatad |
| 7,315,077 B2 | 1/2008 | Choi et al. |

(Continued)

OTHER PUBLICATIONS

U.S. Appl. No. 12/200,819, filed Aug. 28, 2008, entitled "Molded Ultra Thin Semiconductor Die Packages, Systems Using the Same, and Methods of Making the Same".

(Continued)

*Primary Examiner*—Roy K Potter
(74) *Attorney, Agent, or Firm*—Townsend and Townsend and Crew LLP

(57) ABSTRACT

Pre-molded component packages that may be as thin as a leadframe for a semiconductor die, systems using the same, and methods of making the same are disclosed. The leads of an exemplary package are exposed at both surfaces at the leadframe. The packages may be stacked upon one another and electrically coupled at the exposed portions of their leads.

22 Claims, 9 Drawing Sheets

U.S. PATENT DOCUMENTS

| | | | |
|---|---|---|---|
| 7,364,784 B2 * | 4/2008 | Kim et al. | 428/123 |
| 7,402,462 B2 | 7/2008 | Madrid et al. | |
| 7,439,613 B2 | 10/2008 | Joshi et al. | |
| 7,504,733 B2 * | 3/2009 | Lopez | 257/778 |
| 2003/0107126 A1 | 6/2003 | Joshi | |
| 2007/0040254 A1 | 2/2007 | Lopez | |
| 2007/0145579 A1 | 6/2007 | Hoshino et al. | |
| 2007/0164403 A1 | 7/2007 | Huang et al. | |
| 2007/0182003 A1 | 8/2007 | Huber | |
| 2008/0179721 A1 | 7/2008 | Chiang | |

OTHER PUBLICATIONS

U.S. Appl. No. 12/328,541, filed Dec. 4, 2008, entitled "Molded Leadless Package and Assemblies Having Stacked Molded Leadless Packages".

Rao Tummala, "*The SOP Technology for Convergent Electronic & Bio-electronic Systems*", 1st International Workshop on SOP, SIP,SOP Electronics Technologies, Sep. 22-23, 2005, Atlanta Georgia, 31 pages.

"FSA2464 0.4 Ω Low-Voltage Dual DPDT Analog Switch"; Apr. 2008, Fairchild Semiconductor, 12 pages.

International Search Report dated Mar. 26, 2010, corresponding to PCT/US2009/053597, 11 pages.

* cited by examiner

STACKING QUAD PRE-MOLDED COMPONENT PACKAGES, SYSTEMS USING THE SAME, AND METHODS OF MAKING THE SAME

CROSS-REFERENCES TO RELATED APPLICATIONS

NOT APPLICABLE

BACKGROUND OF THE INVENTION

Personal portable electronic products, such as cell phones, personal data assistants, digital cameras, laptops, etc., are generally comprised of several packaged semiconductor IC chips and surface mount components assembled onto interconnect substrates, such as printed circuit boards and flex substrates. There is an ever increasing demand to incorporate more functionality and features into personal portable electronic products, while at the same time shrink the sizes of such devices. This, in turn, has placed ever increasing demands on the design, size, and assembly of the interconnect substrates. As the number of assembled components increases, substrate areas and costs increase, while demand for a smaller form factor increases.

BRIEF SUMMARY OF THE INVENTION

As part of making their invention, the inventors have recognized that there is a need to address the above issues and that it would be advantageous to find ways to enable increases in functionality and performance of electronic products without causing increases in substrate areas and costs, and decreases in product yields. As also part of making their invention, the inventors have recognized that many electronic products have several electrical components, particularly semiconductor dice, that can be grouped together in several small groups that provide specific functions. As also part of making their invention, the inventors have discovered that the substrate area required for a circuit group can be significantly decreased by packaging semiconductor dice and other components in molded packages that can be stacked on top of one another to reduce board space and increase functionality, where each such package may have the thickness of a leadframe, which is significantly smaller than a conventional quad package.

Accordingly, a first general exemplary embodiment according to the invention is directed to a component package broadly comprising a leadframe having a first surface, a second surface parallel to the first surface, a thickness between the first and second surfaces, a component attachment area, and a plurality of first leads. Each said first lead has an interior portion that is disposed within at least the component attachment area of the leadframe, and that has a thickness less than the leadframe's thickness. Each said first lead also has an exterior portion that has a thickness substantially equal to the leadframe's thickness. The exemplary component package further comprises at least one electrical component disposed between the leadframe's first and second surfaces and over the component attachment area. The at least one electrical component has a first surface, a second surface opposite to the first surface, and a plurality of conductive regions disposed at its first surface. A plurality of the conductive regions are electrically coupled to interior portions of at least some of the leadframe's first leads. The exemplary semiconductor die package further comprises a body of an electrically insulating material disposed between at least the first and second surfaces of the leadframe. In some implementations of this exemplary embodiment, the body of electrically insulating material may extend beyond one or both surfaces of the leadframe, with the exterior portions of a plurality of the leadframe's first leads being left uncovered by the body at one or both surfaces of the leadframe. Also in some implementations, the at least one electrical component may comprise a semiconductor die, and the leadframe may comprise a plurality of second leads that have exterior portions, but no interior portions.

Another general exemplary embodiment according to the invention is directed to an electrical package assembly broadly comprising a first package having a plurality of exposed leads, a second package having a plurality of exposed leads and stacked on the first package, and a plurality of bodies of electrically conductive adhesive disposed between the packages and electrically coupling respective exposed leads of the packages together. Each package comprises a leadframe having a first surface, a second surface parallel to the first surface, a thickness between the first and second surfaces, a component attachment area, and a plurality of first leads. Each said first lead has an interior portion that is disposed within at least the component attachment area of the leadframe, and that has a thickness less than the leadframe's thickness. Each said first lead also has an exterior portion that has a thickness substantially equal to the leadframe's thickness. At least one of the packages has a plurality of second leads that have exterior portions, but no interior portions. Each said package further comprises at least one electrical component disposed at least between the leadframe's first and second surfaces and over the component attachment area. The at least one electrical component has a plurality of conductive regions electrically coupled to interior portions of at least some of the leadframe's first leads. Each said package further comprises a body of an electrically insulating material disposed between at least the first and second surfaces of the leadframe. In some implementations of this exemplary embodiment, the body of electrically insulating material may extend beyond one or both surfaces of the leadframe, with the exterior portions of a plurality of the leadframe's leads being left uncovered by the body at one or both surfaces of the leadframe. Also in some implementations, the at least one electrical component may comprise a semiconductor die.

With this exemplary construction, an electrical component package may be as thin as the leadframe used to construct it, with signals to and from the at least one electrical component being conveyed by the leads of the leadframe. This is at least 50 percent thinner than conventional semiconductor die packages. Packages having a common lead pattern may be stacked upon one another to electrically interconnect several electrical components to provide increased functionality within the area footprint of a single component package. The layout of the leads among the packages may be varied to provide a desired interconnect among the stacked components. As another benefit of these exemplary embodiments, electrical components, such as semiconductor dice, having the same circuitry may be stacked and electrically coupled in parallel to provide additional performance within the footprint of a single package, as opposed to using a large device packaged in a larger footprint package. For example, small-scale power-switching MOSFET transistors on individual die may be housed in similar packages having the same small footprint, and may be stacked and electrically coupled in parallel to provide the power-handling performance of a much larger MOSFET device housed in a larger footprint package.

Another general embodiment according to the invention is directed to a method of manufacturing a component package for one or more electrical components, with the package having a first surface and a second surface parallel to the first surface. The exemplary method comprises assembling at least one electrical component and a leadframe together. The leadframe has a first surface parallel to the first surface of the package, a second surface parallel to the first surface of the package, a thickness between its first and second surfaces, a component attachment area, and a plurality of first leads. Each first lead has an interior portion disposed within at least the component attachment area, and an exterior portion that has a thickness substantially equal to the leadframe's thickness. The interior portion has a thickness less than the leadframe's thickness. The at least one electrical component has conductive regions disposed on one of its surfaces. The action of assembling the at least one electrical component and the leadframe together comprises electrically coupling a plurality of conductive regions of the electrical component with the interior portions of at least some of the first leads. The exemplary method further comprises disposing a body of electrically insulating material between the first and second surfaces of the package such that the body has at least one surface that is substantially flush with one surface of the package, and such that the exterior portions of the first leads are exposed at one or more surfaces of the package. In some implementations of the method, the leadframe may comprise a plurality of second leads that have exterior portions, but no interior portions.

Another general embodiment according to the invention is directed to a method of manufacturing a component package for one or more electrical components, with the package having a first surface and a second surface parallel to the first surface. The exemplary method comprises disposing a first body of electrically insulating material between the first and second surfaces of a leadframe, the leadframe having a first surface parallel to the first surface of the package, a second surface parallel to the first surface of the package, a thickness between its first and second surfaces, a component attachment area, and a plurality of first leads. Each first lead has an interior portion disposed within at least the component attachment area, and an exterior portion that has a thickness substantially equal to the leadframe's thickness. The interior portion has a thickness less than the leadframe's thickness. The first body is disposed such that a recess is formed in the body, with the recess being located over the leadframe's component area. The exemplary method further comprises disposing at least one electrical component in the recess and electrically coupling a plurality of conductive regions of the at least one electrical component to the interior portions of at least some of the first leads. The method also comprises disposing a second body of electrically insulating material in the recess adjacent to the at least one electrical component. In some implementations of the method, the leadframe may comprise a plurality of second leads that have exterior portions, but no interior portions.

The present invention also encompasses systems that include packages and package assemblies according to the present invention, each such system having an interconnect substrate and a package or package assembly according to the present invention attached to the interconnect substrate, with electrical connections made therewith.

The above exemplary embodiments and other embodiments of the invention are described in the Detailed Description with reference to the Figures. In the Figures, like numerals may reference like elements and descriptions of some elements may not be repeated.

DETAILED DESCRIPTION OF THE INVENTION

Figure 1:
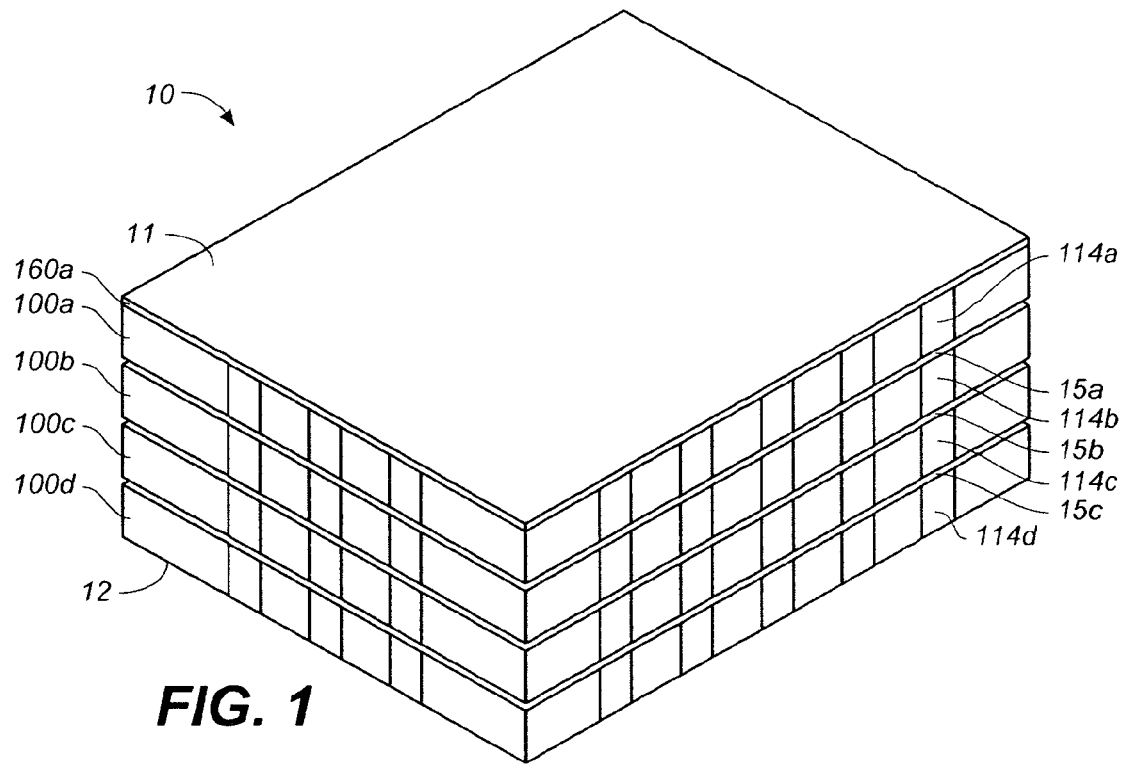
FIG. 1 is a top perspective view of an exemplary embodiment of a package assembly according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. In the drawings, the thicknesses and sizes of layers and regions are exaggerated for clarity, and like reference numerals in the drawings denote like elements. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

Figure 2:
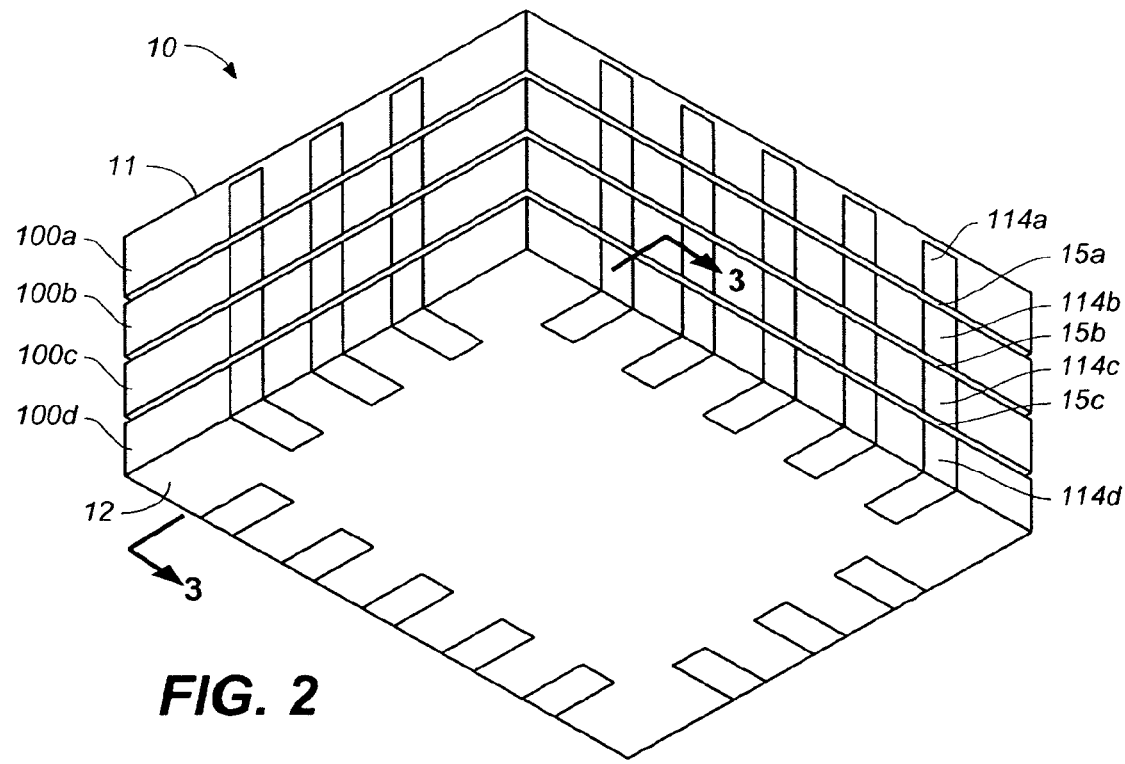
FIG. 2 is a bottom perspective view of an exemplary embodiment of a package assembly according to the present invention.

FIG. 1 shows a top perspective view of an exemplary embodiment of a package assembly 10 according to the present invention, and FIG. 2 shows a bottom perspective view thereof. Assembly 10 comprises a top surface 11, a bottom surface 12, and four component packages 100a-100d stacked upon one another and disposed between surfaces 11 and 12 of assembly 10. Packages 100a-100d comprise respective pluralities of exposed leads 114a-114d, which are preferably located at the peripheries of the packages and exposed at the major surfaces of the packages. A plurality of the exposed leads of packages 100a and 100b are electrically coupled to one another by respective bodies 15a of electrically conductive material, which may comprise a reflowed solder, a cured conductive polymer, etc. Similarly, a plurality of the exposed leads of packages 100b and 100c are electrically coupled to one another by respective bodies 15b of electrically conductive material, and a plurality of the exposed leads of packages 100c and 100d are electrically coupled to one another by respective bodies 15c of electrically conductive material. Each package 100a-100d may comprise one or more electrical components, each of which may comprise a semiconductor die. Two or more of the packages may comprise identical sets of electrical components, which may be coupled to the package leads in the same way or in different ways, or may comprise different sets of electrical components. The top package in the stack, in this case package 100a, may have a layer 160a of electrically-insulating material formed over its top major surface.

Figure 3:
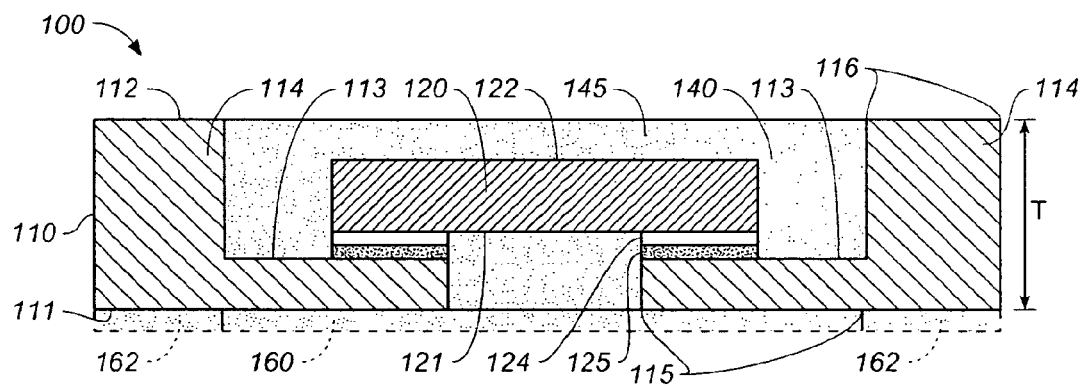
FIG. 3 is a cross-sectional view of a first exemplary semiconductor die package according to the present invention.

FIG. 3 is a cross-sectional view of a first exemplary electrical component package 100 that may be used for any of packages 100a-100d. Package 100 comprises a leadframe 110 having a first surface 111, a second surface 112 parallel to first surface 111, a thickness T between the first and second surfaces, a component attachment area 113, and a plurality of leads 114. Component attachment area 113 is accessible at the leadframe's second surface 112 (i.e., components may be inserted into area by way of second surface 112). Each of the leads 114 has an exterior portion 116 that has a thickness substantially equal to the leadframe's thickness (e.g., to within 10%), and is preferably flush with the leadframe's first surface 111 and second surface 112. Some of the leads 114 have interior portions 115 disposed within at least the component attachment area 113, with each interior portion having a thickness less than the leadframe's thickness T. Each interior portion 115 is integrally formed with the exterior portion 116 of its lead 114 (formed together or with an intermediate section between them), meaning that they are formed from at least one common body of material and that the composition of the material does not substantially change along the lead. Those leads 114 that only have exterior portions 116 may be used to route signals between vertically-stacked packages. (Leads that have both interior and exterior portions may do this as well.)

Package 100 further comprises at least one semiconductor die 120 (or electrical component 120) disposed between the leadframe's first surface 111 and second surface 112, and over the component attachment area 113. Semiconductor die 120 (or electrical component 120) has a first surface 121, a second surface 122 opposite to its first surface 121, and a plurality of conductive regions 124 disposed at first surface 121. Conductive regions 124 are electrically coupled to interior portions 115 of some of the leadframe's leads 114, such as by bodies of conductive adhesive 125. In this regard, die 120 (or component 120) may be flip-chip bonded to interior portions 115. Not all of the interior portions 115 need to be electrically coupled to die 120.

A gap 140 is present between the leadframe's leads 114 and between leadframe 110 and die 120. A body 145 of electrically insulating material is disposed in gap 140. Body 145 is preferably disposed between the leadframe's first surface 111 and second surface 112, with the exterior portions 116 of leads 114 exposed, and may extend over second surface 112 to provide an insulating layer 160. If layer 160 is present, portions 162 thereof are omitted or removed so as to expose surfaces of the exterior portions 116. The top surface of body 145 is preferably flush with the top surface of leadframe 110 and second surface 112 of package 100. To be substantially flush, the difference in heights between the surfaces is not more than 100 microns. The difference is typically not more than 50 microns. In cases where body 145 does not provide layer 160, the bottom surface of body 145 is preferably flush with the bottom surface of leadframe 110 and first surface 111 of package 100. In some embodiments, body 145 encases the bottom surface 122 and side surfaces of component 120.

With this construction, packages can be made with thicknesses that are substantially the same as the thickness of leadframe 110, thereby providing very thin semiconductor die packages and component packages. Typical leadframe thicknesses range from 100 microns to 250 microns, and packages according to the present invention may be as thin as these thicknesses. These thicknesses are at least 50 percent less than the thicknesses of prior art semiconductor die packages. Accordingly, the package assembly 10 of four stacked packages 100a-100d shown in FIGS. 1 and 2 may have a thickness of 1 mm or less, a width of 2 mm, and a length of 2.5 mm for semiconductor dice that are 0.1 mm thick, 0.5 mm wide, and 0.8 mm long. The thin package provides excellent thermal performance by minimizing the distance between the die and an external heat sink, and provides excellent electrical characteristics by minimizing interconnect distances and lead distances. Moreover, the exterior portions 115 of leads 114 may be configured so that they conform to industry standard pin-outs. The leads 114 may also be fanned outward from the die (such as for small die) to redistribute the chip's interconnect pads to an industry standard pattern. Also, the center-tocenter spacing distance between adjacent exterior portions 115 of leads 114 may be as small as 0.4 mm, which provides for the ability to have high-density leads. All of these features make package 100 an excellent choice for use in portable devices and devices that need ultra thin components.

Referring back to FIGS. 1 and 2, packages 100a-100d may have identical circuits (and components and/or semiconductor dice), in which case their respective circuits are electrically coupled in parallel. The parallel interconnection can provide increased circuit performance within the footprint of package 100a, such as by increasing the current handling capability of a power-handling circuit. As another possibility, two of the packages may have identical circuits and may include power-handling devices, while the third and fourth packages have different circuits, such as control circuits for controlling the power handling devices in the other two packages. This configuration may be used to increase circuit performance and functionality within the footprint of package 100a. As yet another possibility, all four packages may have different circuits. This configuration may be used to increase circuit functionality within the footprint of package 100a. To facilitate the stacking interconnection of different packages, the layout of the leads 114 for the packages may be different. Packages 100a-100d may be stacked such that first surface 111 of one package faces the second surface 112 of another package. The packages may also be stacked so that one or more of the packages are reversed from this orientation, and have their second surfaces 112 face the second surfaces of other packages, or have their first surfaces 111 face the first surfaces of other packages. The reversal of orientation can provide for additional flexibility in routing signal connections between the components of the packages.

Figure 4:
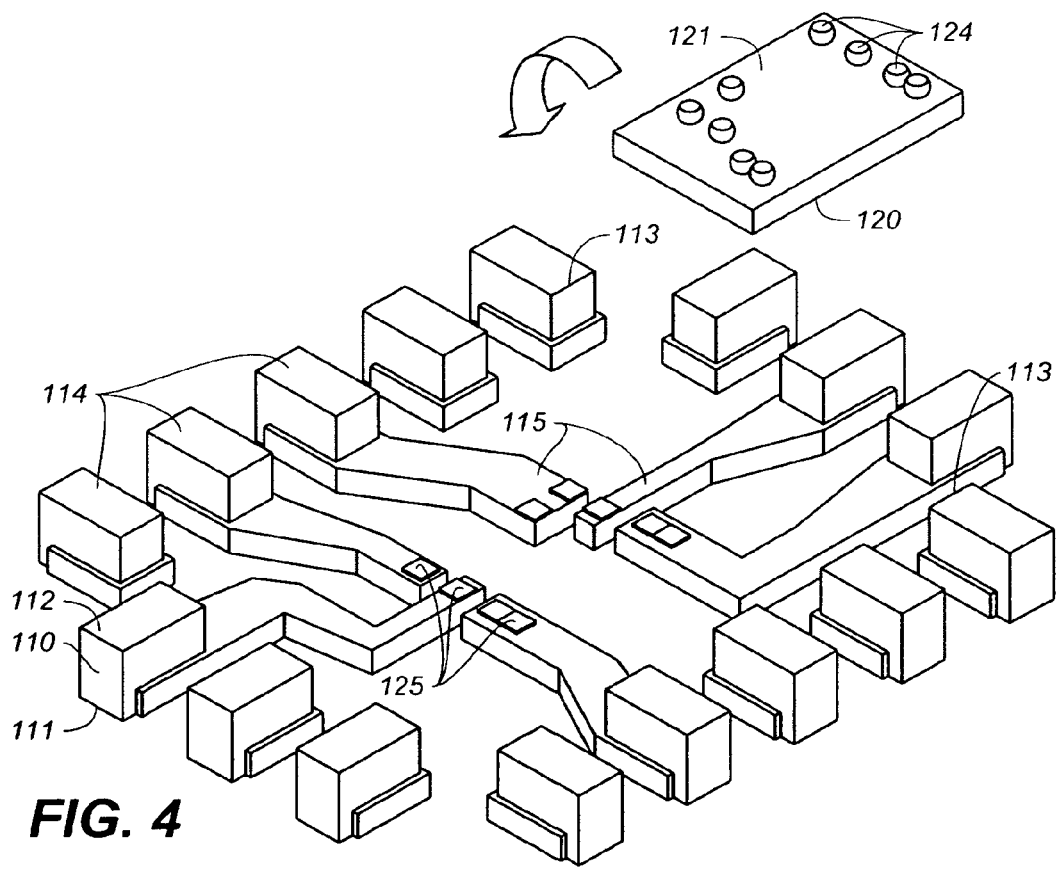
FIGS. 4-6 show various views of an exemplary package being fabricated according to an exemplary method according to the present invention.
Figure 5:
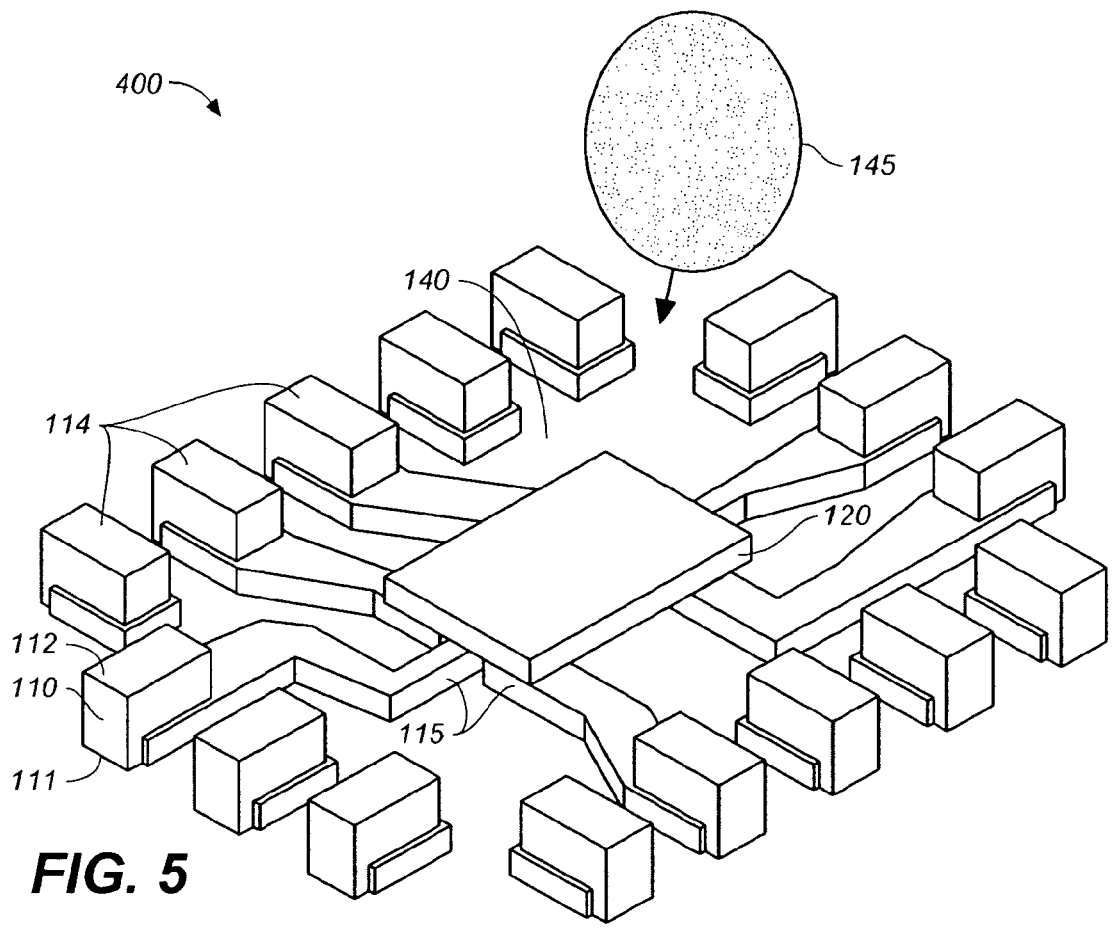
Figure 6:
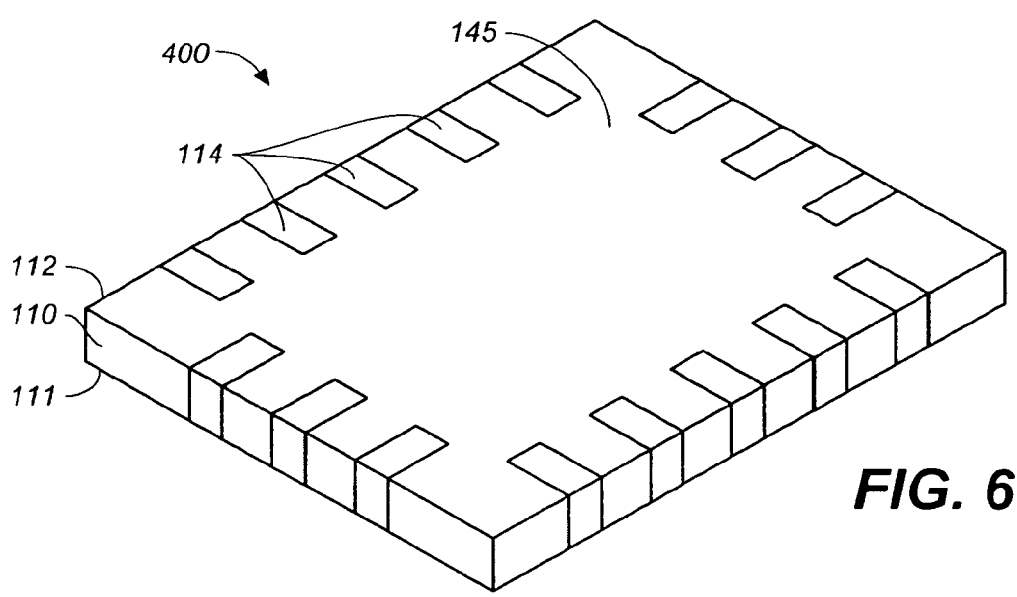

FIGS. 4-6 illustrate an exemplary method of making package 100 (and packages 100a-100d). Referring to FIG. 4, the exemplary method comprises assembling semiconductor die 120 (or electrical component 120) and leadframe 110 together. This may comprise disposing bodies 125 of conductive adhesive on interior portions 115 of leads 114, or on conductive regions 124 of die 120, or on both, followed by joining components 110 and 120 together. Bodies 125 may then be reflowed (such as in the case they comprise solder), or exposed to heat, ultraviolet light, or a chemical reaction (such as in the case they comprise a conductive polymer). An assembly 400 results from these actions, as shown in FIG. 5. While FIGS. 4 and 5 illustrate die 120 being flip-chip mounted to the interior portions 115 of leadframe 110, it may be appreciated that other connection approaches could be used.

Referring to FIG. 5, a body 145 of electrically insulating material may be disposed in the gap 140 around components 110 and 120, and between surfaces 111 and 112 of leadframe 110, such that the body solidifies and adheres to die 120 and leads 114. The result of the action is shown in FIG. 6. The action may be readily accomplished by placing assembly 400 in a conventional molding tool. Body 145 may be injected into gap 140 in liquid form before or after the elements of the molding tool have been placed in contact with assembly 400, and allowed to solidify (such as by cooling, heating, chemical reaction, curing, and/or exposure to ultraviolet light, depending upon the properties of the material). Any known molding materials, molders, and molding methods may be used. The body 145 of insulating material may also be disposed into gap 140 using any known encapsulant printing method, which is similar to screen-printing. The printing may occur from any side of the leadframe. Printing from the second side 112 would readily facilitate forming the layer 160 of electrically insulating material with uncovered portions 162 (see FIG. 3).

Because body 145 is preferably formed flush with the leadframe's surfaces in many embodiments, another approach is possible. In this approach, a temporary release layer is adhered to the bottom surface of a string of attached assemblies 400 (e.g., a roll of assemblies). The assemblies 400 are moved over a flat, non-stick platform, and moved underneath a doctor blade. The doctor blade is positioned over the platform and in contact with the top surface of the assemblies. Hot molding material may be disposed in front of the doctor blade, on the upstream side of the blade, which then forces the material into gaps while at the same time making it flush with top surfaces of the assembles. On the downstream side of the doctor blade, the molding material is allowed to cool and solidify. Packages 100 may then be separated from assemblies 400 by cutting. Any known cutting tool, such as a laser and/or die saw, may be used.

Figure 7:
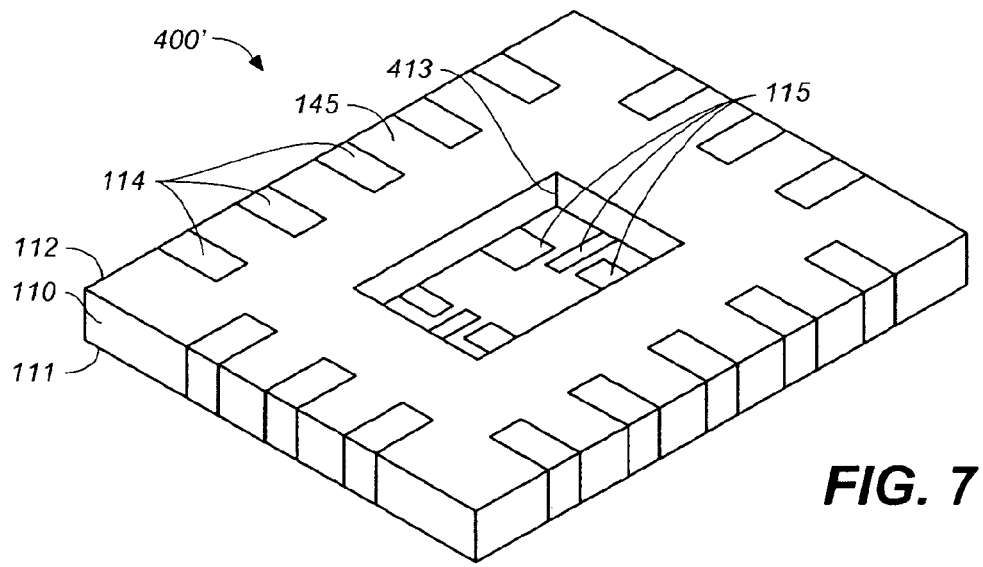
FIGS. 7-10 show various views of an exemplary package being fabricated according to another exemplary method according to the present invention.

FIGS. 7-10 illustrate another exemplary method of making package 100 (and packages 100a-100d). Referring to FIG. 7, a body 145 of electrically insulating material is disposed between surfaces 111 and 112 of leadframe 110, and with a recess 413 formed over the interior portions 115 of leads 114. Body 145 is disposed such that it solidifies and adheres to leads 114. The action may be readily accomplished by placing leadframe 110 in a conventional molding tool which has a protruding mesa to form recess 413. The resulting assembly is shown at 400' in the figure. Body 145 may be disposed over leadframe 110 in liquid form before or after the elements of the molding tool have been placed in contact with leadframe 110, and thereafter allowed to solidify (such as by cooling, heating, chemical reaction, curing, and/or exposure to ultraviolet light, depending upon the properties of the material). Any known appropriate molding materials, molders, and molding methods may be used. Parts of interior portions 115 are left exposed after body 145 is disposed and formed to allow electrical connections with die 120. If needed, a cleaning action may be performed to clear any flashing from the bottom of recess 413.

Figure 8:
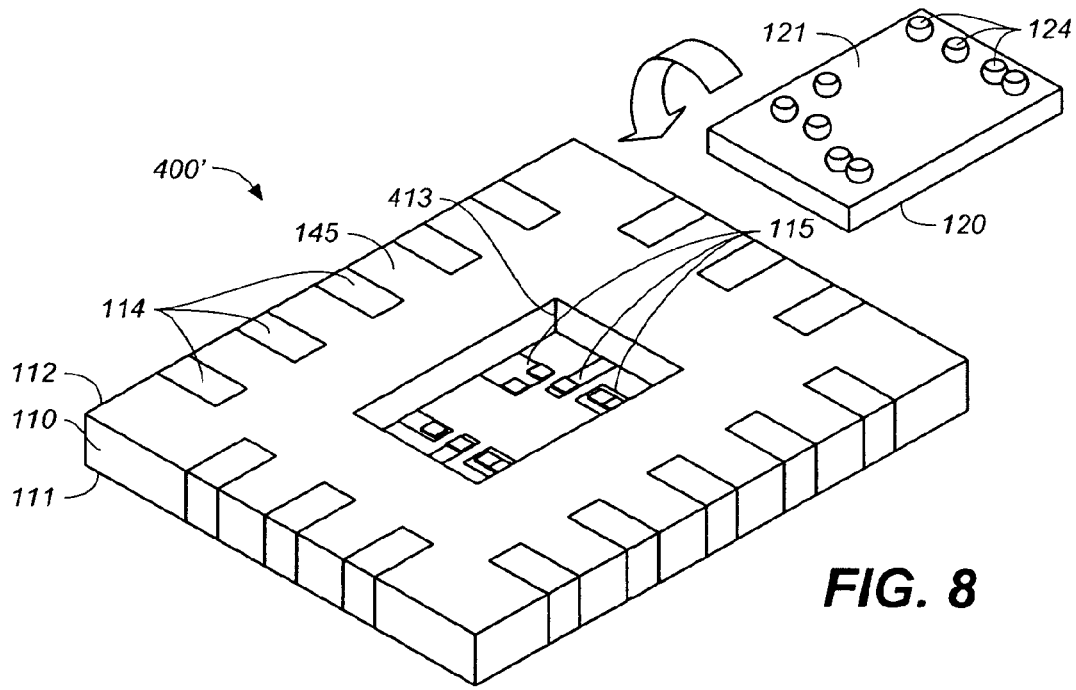

Referring to FIG. 8, the exemplary method further comprises assembling semiconductor die 120 (or electrical component 120) and assembly 400' together, where assembly 400' comprises leadframe 110 and body 145. This may comprise disposing bodies 125 of conductive adhesive on interior portions 115 of leads 114, or on conductive regions 124 of die 120, or on both, followed by joining components 400' and 120 together, with die being disposed in recess 413. Bodies 125 may then be reflowed (such as in the case they comprise solder), or exposed to heat, ultraviolet light, or a chemical reaction (such as in the case they comprise a conductive polymer). In this manner, die 120 is disposed in recess 413 and a plurality of its conductive regions are electrically coupled to the interior portions of at least some of the first leads. While FIG. 8 illustrates die 120 being flip-chip mounted to the interior portions 115 of leadframe 110, it may be appreciated that other connection approaches could be used. For example, interior portions 115 may be spaced at the periphery of recess 413, the back surface of die may be adhered to the bottom surface of recess 413, and wirebonds may be used to electrically couple interior portions 115 and conductive regions 124.

Figure 9:
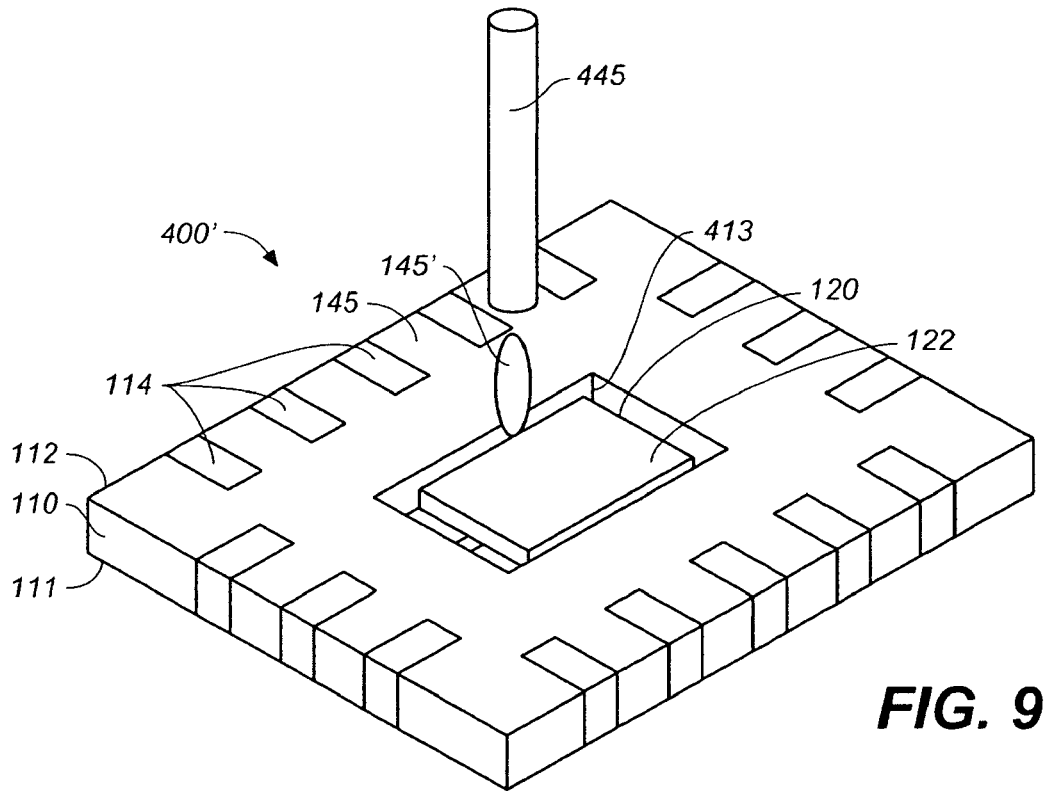
Figure 10:
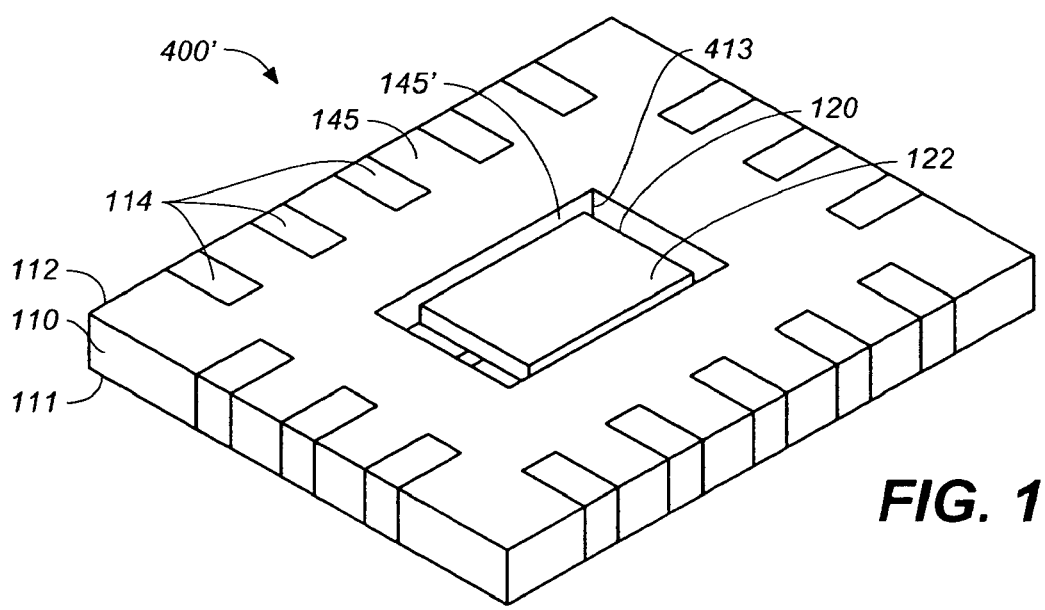

Referring to FIG. 9, the exemplary method further comprises disposing a second body 145' of electrically insulating material in the gap between die 120 and recess 413. While body 145' may comprise the same material as body 145, it preferably comprises an underfill material, which is able to flow underneath die 120 by capillary action. A body 145' of underfill material may be disposed in liquid form by a dispensing tool 445, and thereafter allowed to solidify (such as by cooling, heating, chemical reaction, curing, and/or exposure to ultraviolet light, depending upon the properties of the material). Body 145' may also be disposed over the exposed second surface 122 of die 120 to electrically insulate the back surface of the die. The resulting assembly 400' is shown in FIG. 10. Packages 100 may then be separated from assembly 400' by cutting. Any known cutting tool, such as a laser and/or die saw, may be used.

Thus, it should be understood that leadframe 110, electrical component 120, and body 145 of electrical insulating material may be assembled together in different time sequences. Accordingly, it should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action proceeds or follows another action).

The semiconductor die packages described above can be used in electrical assemblies including circuit boards with the packages mounted thereon. They may also be used in systems such as phones, computers, etc. It may be appreciated that more than one electrical component may be assembled with leadframe 110 to provide greater functionality and circuit density.

Figure 11:
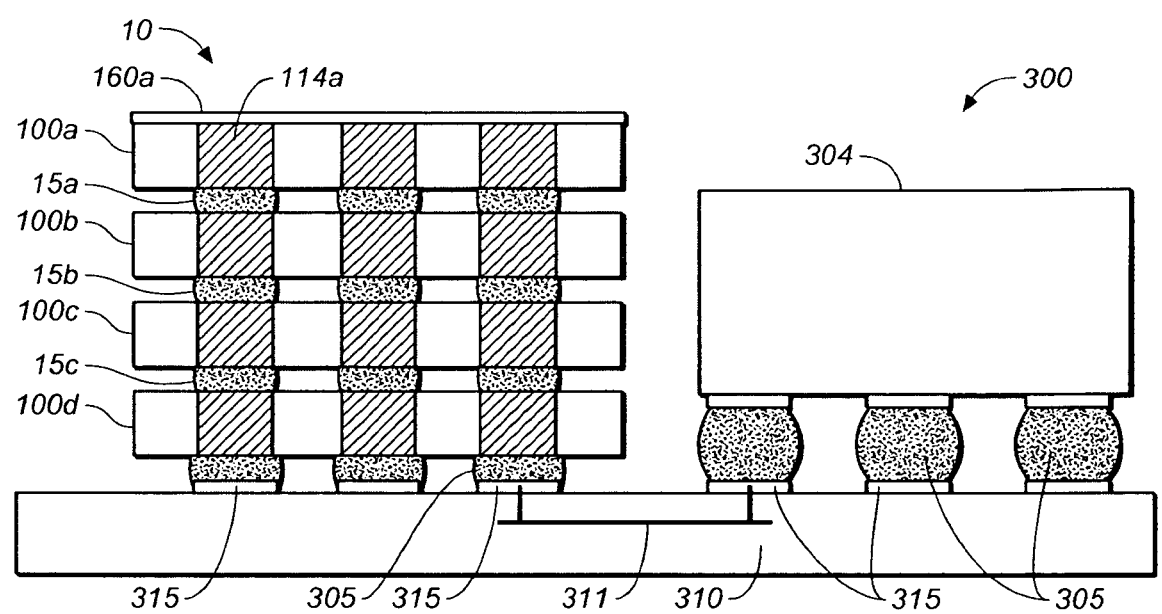
FIG. 11 shows an exemplary system according to the present invention.

FIG. 11 is a side view of an exemplary system 300 that comprises an interconnect board 310 having a plurality of electrical interconnect pads 315, package 100d disposed on the top surface interconnect board 310, package 100c disposed over package 100d, package 100b disposed over package 100c, and package 100a disposed over package 100b. The leads 114 of packages 110a-110d are electrically coupled by bodies 15a-15c of conductive adhesive, as discussed above. The leads 114 of package 100d are electrically coupled to respective pads 315 by corresponding bodies 305 of electrically conductive adhesive, which may comprise a solder, an electrically conductive polymer, etc. System 300 also comprises an electrical package 304 that is also electrically coupled to respective pads 315 by adhesive bodies 305. Package 304 may comprise a passive electronic component, or may comprise a package having the same construction as packages 100a-100d, or a different construction, and may be electrically coupled to package 100d by one or more electrical traces 311 disposed in or on interconnect substrate 310. Package 100d may be mounted so that its second surface 112 faces interconnect substrate 310, as shown in FIG. 3, or may be mounted so that its first surface 111 faces interconnect substrate 310. In the latter case, when package 100 is in the opposite orientation, portions of layer 160 over the leads 114 are preferably removed. However, the removal is not necessary since solder adhesive bodies 305 may be adhered to the side surfaces of the leads 114 (although this increases the effective footprint of the package).

Figure 12:
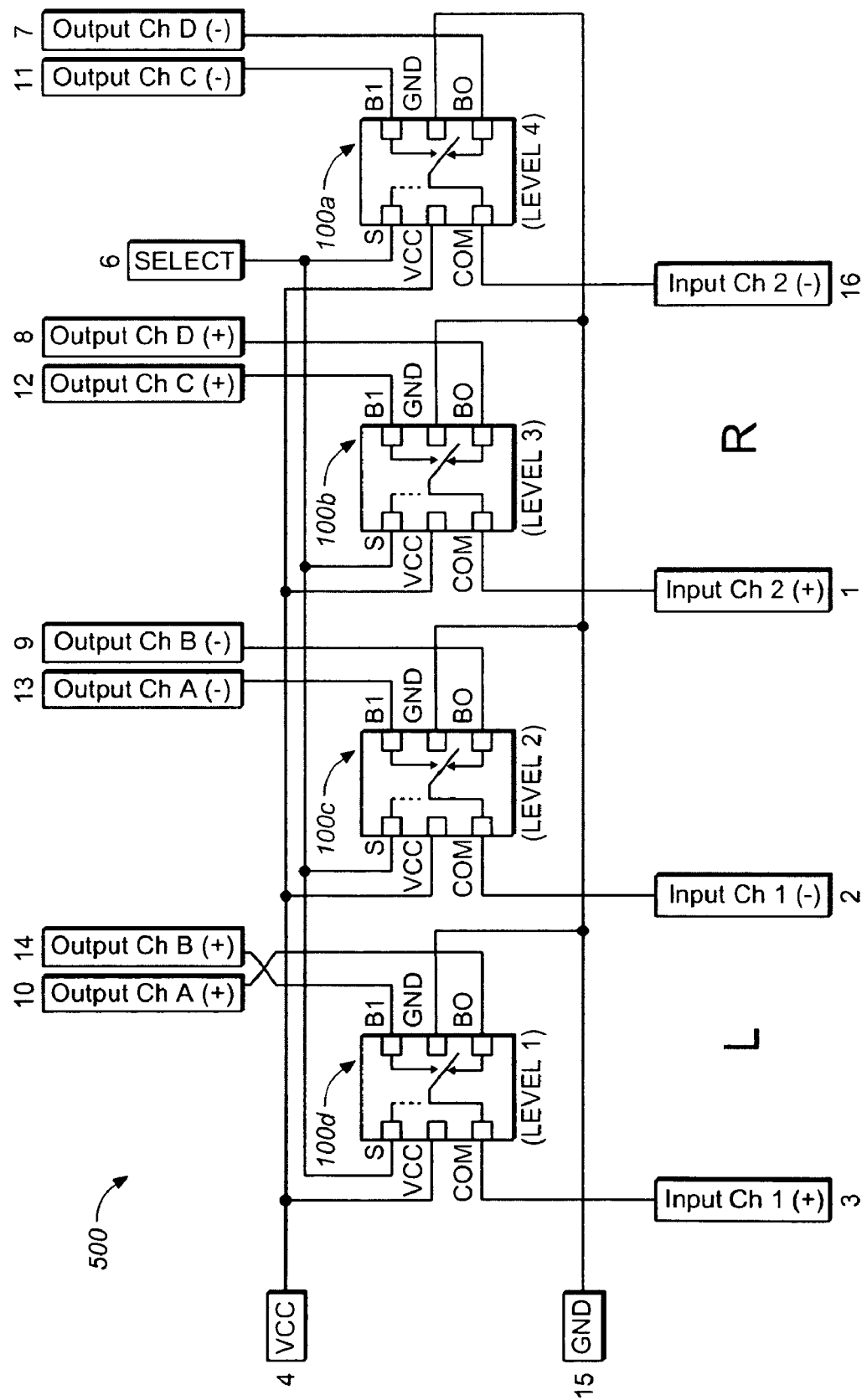
FIG. 12 shows a schematic diagram of an exemplary circuit that may be packaged by an exemplary package assembly according to the present invention.
Figure 13:
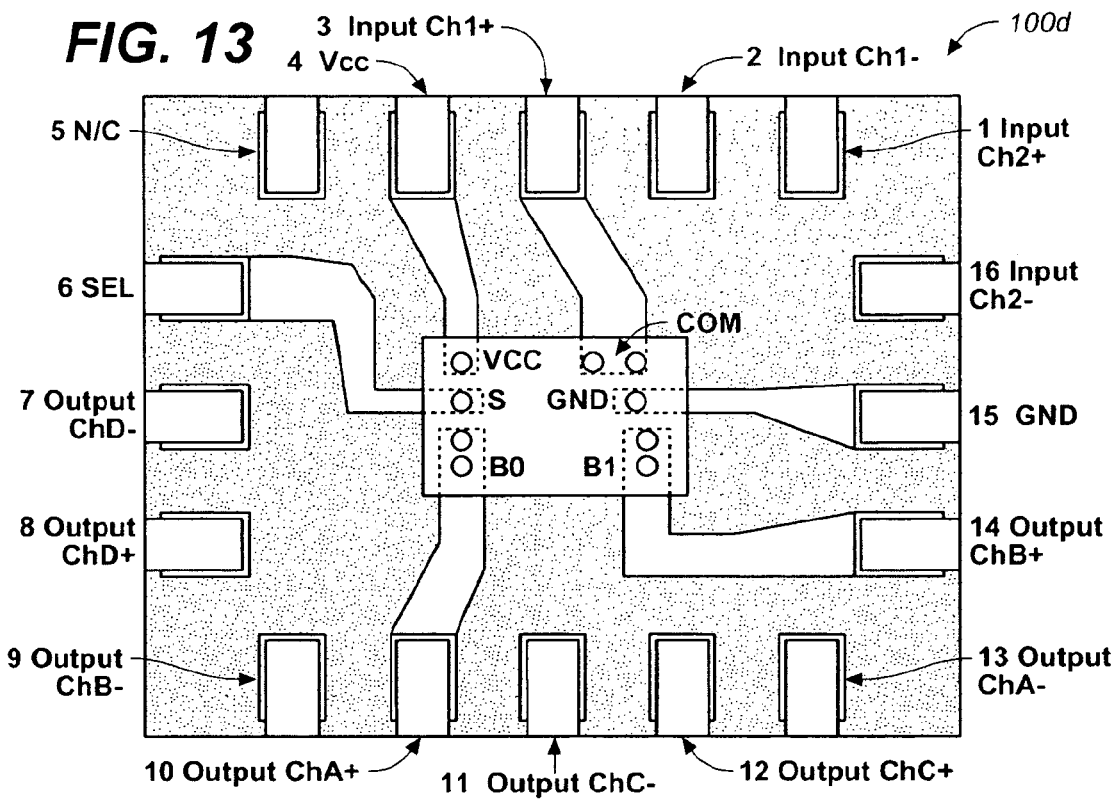
FIGS. 13-16 show exemplary lead patterns of an exemplary set of packages of a package assembly for housing the circuit of FIG. 12 according to the present invention.
Figure 14:
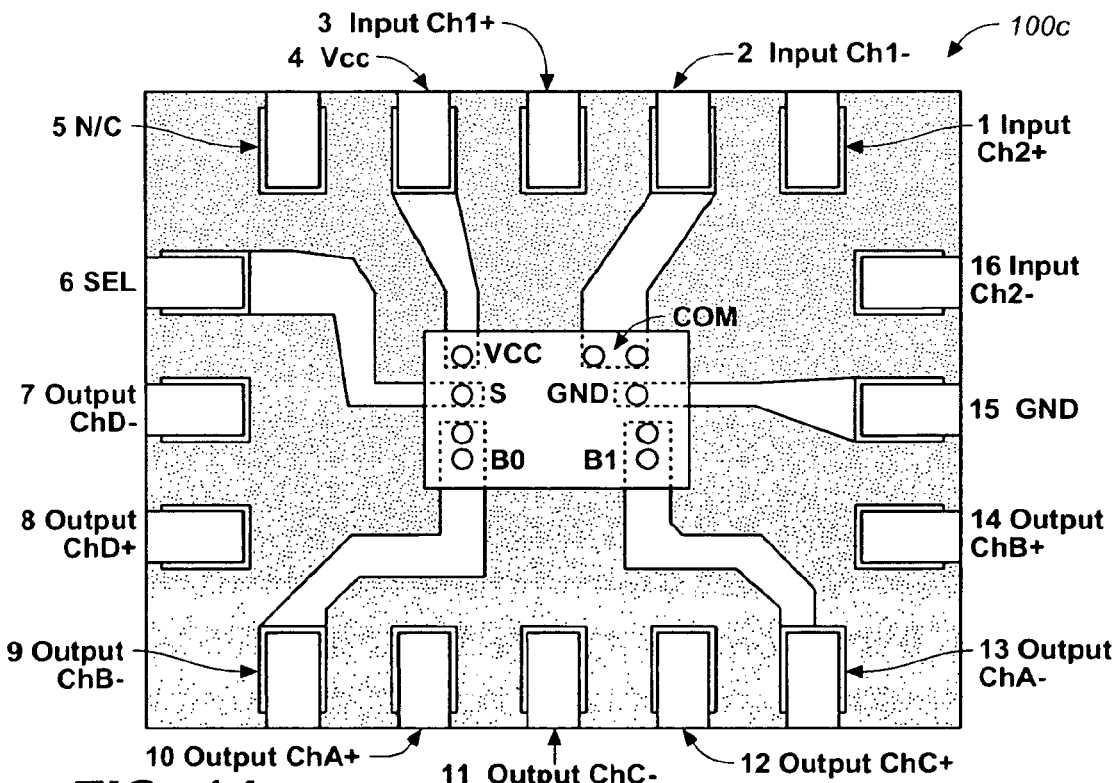
Figure 15:
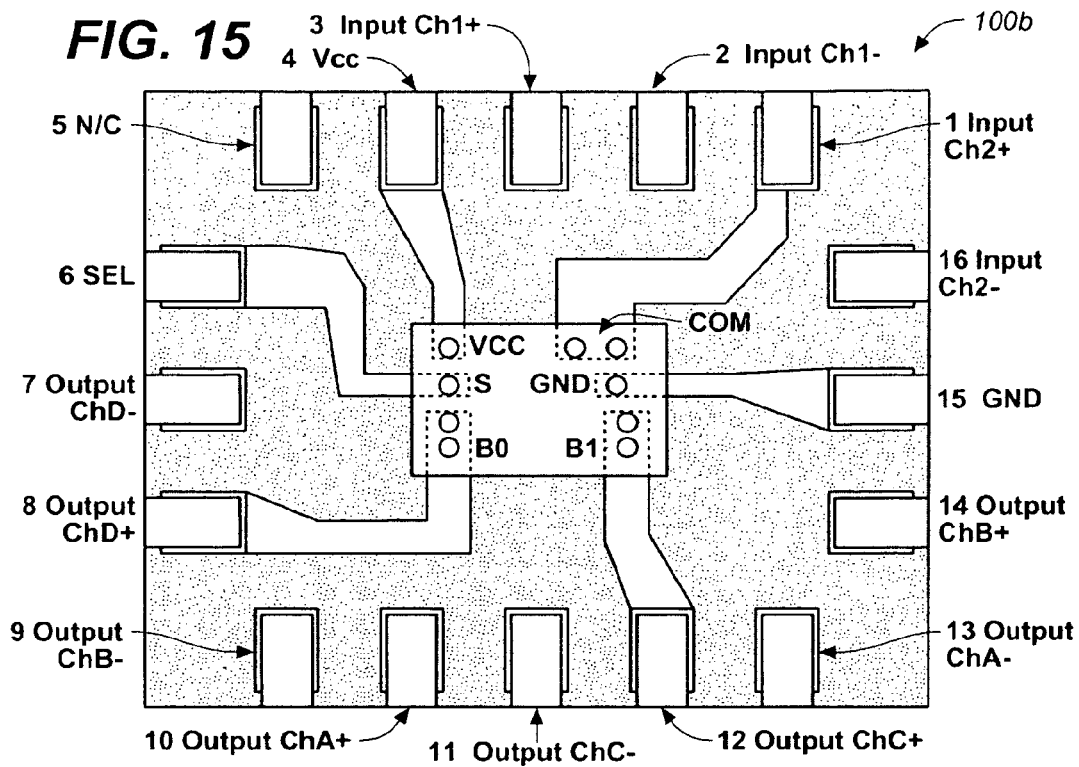
Figure 16:
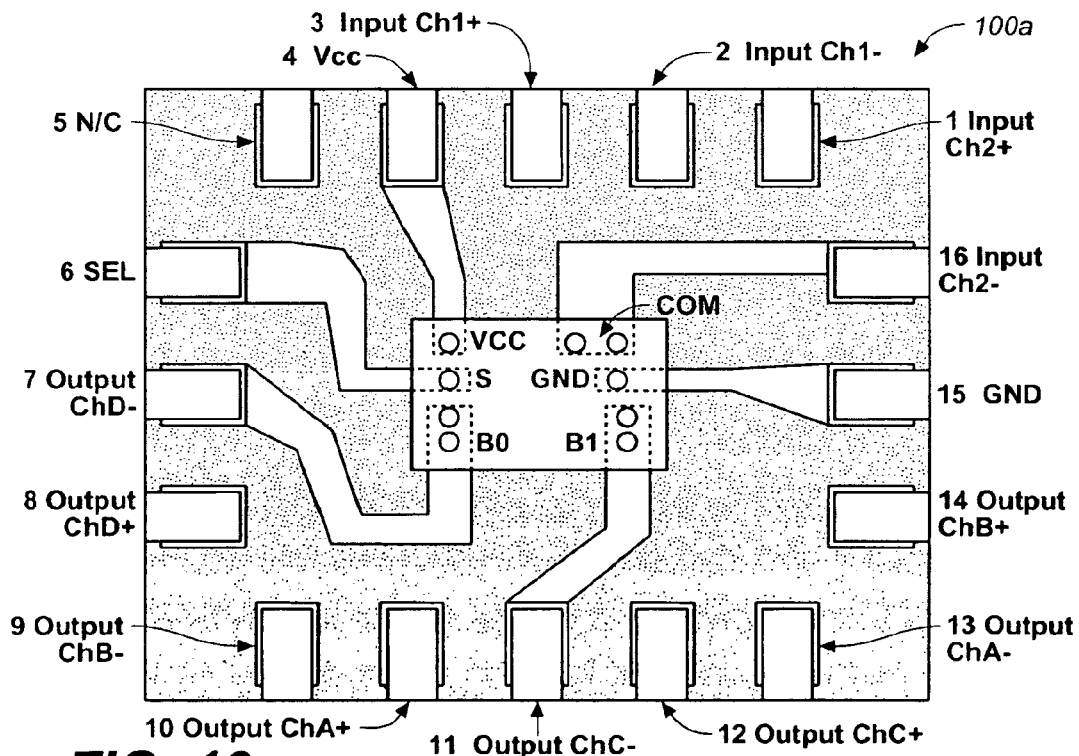

FIG. 12 shows an exemplary circuit 500 that may be implemented by the exemplary packages 100a-110d shown in FIGS. 1 and 2. Circuit 500 is a stereo audio switch that switches a 2-channel audio signal between two different destinations, such as a headphone or set of stereo speakers. Such switches are useful in the personal electronic device fields. The circuit has the signals shown below in Table I.

TABLE I

| Circuit Signals | Use |
| --- | --- |
| Input Ch1+, Ch1 | source left channel |
| Input Ch2+, Ch2− | source right channel |
| Output ChA+, ChA | Destination A, left channel |
| Output ChB+, ChB | Destination B, left channel |
| Output ChC+, ChC | Destination A, right channel |
| Output ChD+, ChD | Destination B, right channel |
| VCC | Power |
| GND | Ground |
| SELECT | Selects between destinations A and B |

The circuit comprises four analog switches, each of which is embodied on a separate semiconductor die, with six conductive regions (terminals) as follows: VCC to receive power, GND to receive ground, S to receive the select signal, COM to connect to the common terminal of the analog switch, B0 to connect to a first pole of the analog switch, and B1 to connect to a second pole of the analog switch. FIGS. 13-16 show the lead layouts of packages 100d, 100c, 100b, and 100a, respectively, for the circuit. The leads are number 1-16, and these numbers appear in the circuit of FIG. 12.

Some of the examples described above are directed to "leadless"-type packages such as MLP-type packages (molded leadless packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. An electrical component package comprising:
    a leadframe having a first surface, a second surface parallel to the first surface, a thickness between the first and second surfaces, a component attachment area, a plurality of first leads, and one or more second leads, each said first lead having an interior portion disposed within at least the component attachment area and having a thickness less than the leadframe's thickness, and an exterior portion having a thickness substantially equal to the leadframe's thickness, each second lead being disposed outside of the component attachment area and having a thickness substantially equal to the leadframe's thickness;

at least one electrical component disposed between the leadframe's first and second surfaces and over the component attachment area, the at least one electrical component comprising a semiconductor die having a first surface, a second surface opposite to the first surface, and a plurality of conductive regions disposed at its first surface, the semiconductor die being flip-chip bonded to the interior portions of a plurality of first leads with a plurality of the conductive regions being electrically coupled to interior portions of at least some of the leadframe's first leads by flip-chip bonds; and a body of an electrically insulating material disposed between at least the first and second surfaces of the leadframe.

2. The electrical component package of claim 1 wherein at least one surface of the body of electrically insulating material is substantially flush with one surface of the package, and wherein the exterior portions of the first leads are exposed at one or more surfaces of the package.

3. The electrical component package of claim 1 wherein the interior portion and the exterior portion of each first lead are integrally formed from a common body of material.

4. The electrical component package of claim 1 wherein the body of electrically insulating material is disposed on at least one of the first and second surfaces of the at least one electrical component.

5. An electrical component package comprising:
a leadframe having a first surface, a second surface parallel to the first surface, a thickness between the first and second surfaces, a component attachment area, and a plurality of first leads, each said first lead having an interior portion disposed within at least the component attachment area and having a thickness less than the leadframe's thickness, and an exterior portion having a thickness substantially equal to the leadframe's thickness;
a body of an electrically insulating material disposed between at least the first and second surfaces of the leadframe, wherein the body of electrically insulating material comprises a recess located over the interior portions of a plurality of first leads; and
at least one electrical component disposed in the recess and between the leadframe's first and second surfaces, and further over the component attachment area and with a gap between the at least one electrical component and the body of an electrically insulating material, the at least one electrical component having a first surface, a second surface opposite to the first surface, and a plurality of conductive regions disposed at its first surface, a plurality of the conductive regions being electrically coupled to interior portions of at least some of the leadframe's first leads.

6. The electrical component package of claim 5 further comprising a second body of electrically insulating material disposed in the recess and adjacent to the at least one semiconductor die of the package layer.

7. The electrical component package of claim 6 wherein the exposed surfaces of the at least one electrical component are covered by the second body of electrically insulating material.

8. The electrical component package of claim 1 wherein the interior portions of a plurality of the first leads have a thickness less than the thickness of the exterior portions of said plurality of first leads.

9. The electrical component package of claim 1 wherein the leadframe has a plurality of second leads.

10. A package assembly comprising:
a first package and a second package, each package comprising an electrical component package having:
a leadframe having a first surface, a second surface parallel to the first surface, a thickness between the first and second surfaces, a component attachment area, a plurality of first leads, each said first lead having an interior portion disposed within at least the component attachment area and having a thickness less than the leadframe's thickness, and an exterior portion having a thickness substantially equal to the leadframe's thickness,
at least one electrical component disposed between the leadframe's first and second surfaces and over the component attachment area, the at least one electrical component comprising a semiconductor die having a first surface, a second surface opposite to the first surface, and a plurality of conductive regions disposed at its first surface, the semiconductor die being flip-chip bonded to the interior portions of a plurality of first leads with a plurality of the conductive regions being electrically coupled to interior portions of at least some of the leadframe's first leads by flip-chip bonds, and
a body of an electrically insulating material disposed between at least the first and second surfaces of the leadframe,
wherein at least one of the packages one or more second leads that have exterior portions; and
a plurality of bodies of electrically conductive adhesive disposed between a surface of the first package and a second surface of the second package with each body of electrically conductive material being electrically coupled to an exterior portion of a lead of the first package and an exterior portion of a lead of the second package.

11. The package assembly of claim 10 wherein the interior portions of the leads of the first package have a first layout, and wherein the interior portions of the leads of the second package have a second layout that is different from the first layout.

12. The package assembly of claim 10 wherein the interior portions of the leads of the first package have a first layout, and wherein the interior portions of the leads of the second package have a second layout that comprises the first layout.

13. A system comprising an interconnect substrate and the electrical component package of claim 1 attached to the interconnect substrate.

14. A package assembly comprising:
a first package and a second package, each package comprising an electrical component package having:
a leadframe having a first surface, a second surface parallel to the first surface, a thickness between the first and second surfaces, a component attachment area, and a plurality of first leads, each said first lead having an interior portion disposed within at least the component attachment area and having a thickness less than the leadframe's thickness, and an exterior portion having a thickness substantially equal to the leadframe's thickness,
at least one electrical component disposed between the leadframe's first and second surfaces and over the component attachment area, the at least one electrical component having a first surface, a second surface opposite to the first surface, and a plurality of conductive regions disposed at its first surface, a plurality of the conductive regions being electrically coupled to interior portions of at least some of the leadframe's first leads, and a body of an electrically insulating material disposed between at least the first and second surfaces of the leadframe; and a plurality of bodies of electrically conductive adhesive disposed between a surface of the first package and a second surface of the second package with each body of electrically conductive material being electrically coupled to an exterior portion of a lead of the first package and an exterior portion of a lead of the second package; and wherein the interior portions of the leads of the first package have a first layout, and wherein the interior portions of the leads of the second package have a second layout that is different from the first layout.

15. A method of making an electrical component package having a first surface and a second surface parallel to the first surface, the method comprising:

assembling at least one electrical component and a leadframe together, the leadframe having a first surface parallel to the first surface of the package, a second surface parallel to the first surface of the package, a thickness between its first and second surfaces, a component attachment area, a plurality of first leads, and one or more second leads, each said first lead having an interior portion disposed within at least the component attachment area, and an exterior portion having a thickness substantially equal to the leadframe's thickness, the interior portion having a thickness that is less than the leadframe's thickness, each second lead being disposed outside of the component attachment area and having a thickness substantially equal to the leadframe's thickness, the at least one electrical component comprising a semiconductor die having conductive regions disposed on one of its surfaces, wherein assembling the at least one electrical component and the leadframe together comprises flip-chip bonded the semiconductor die to the interior portions of a plurality of first leads with a plurality of conductive regions of the semiconductor die being electrically coupled to the interior portions of at least some of the first leads by flip-chip bonds; and disposing a body of electrically insulating material between the first and second surfaces of the package such that the body has at lest one surface that is substantially flush with one surface of the package and such that the exterior portions of the first leads are exposed at one or more surfaces of the package.

16. The method of claim 15 wherein assembling the at least one electrical component and a leadframe together further comprises flip-chip bonding at least one electrical component to the leadframe with conductive regions of the electrical component facing interior portions of at least some of the first leads.

17. The method of claim 15 wherein the body of electrically insulating material has a second surface that is substantially flush with another surface of the package.

18. The method of claim 15 wherein the body of electrically insulating material is disposed such that the exterior portions of the first leads are exposed at the first and second surfaces of the electrical component package.

19. A method of making an electrical component package having a first surface and a second surface parallel to the first surface, the method comprising:

disposing a first body of electrically insulating material between the first and second surfaces of a leadframe, the leadframe having a first surface parallel to the first surface of the package, a second surface parallel to the first surface of the package, a thickness between its first and second surfaces, a component attachment area, and a plurality of first leads, each said first lead having an interior portion disposed within at least the component attachment area, and an exterior portion having a thickness substantially equal to the leadframe's thickness, the interior portion having a thickness less than the leadframe's thickness, the first body being disposed such that a recess is formed in the body, the recess being located over the leadframe's component area;

disposing at least one electrical component in the recess and electrically coupling a plurality of conductive regions of the at least one electrical component to the interior portions of at least some of the first leads; and disposing a second body of electrically insulating material in the recess adjacent to the at least one electrical component.

20. The method of claim 19 wherein electrically coupling a plurality of conductive regions of the at least one electrical component to the interior portions of at least some of the first leads comprises flip-chip bonding at least one electrical component to the leadframe with conductive regions of the electrical component facing interior portions of at least some of the first leads.

21. The method of claim 19 wherein disposing the first body of electrically insulating material comprises disposing the material such that the first body has at least one surface that is substantially flush with one surface of the package and such that the exterior portions of the first leads are exposed at one or more surfaces of the package.

22. The method of claim 21 wherein the first body of electrically insulating material is disposed such that the exterior portions of the first leads are exposed at the first and second surfaces of the electrical component package.

* * * * *